United States Patent [19]

Cummins

[11] Patent Number: 5,570,090
[45] Date of Patent: Oct. 29, 1996

[54] DAC WITH DIGITALLY-PROGRAMMABLE GAIN AND SYNC LEVEL GENERATION

[75] Inventor: Timothy J. Cummins, Cratloe, Ireland

[73] Assignee: Analog Devices, Incorporated, Norwood, Mass.

[21] Appl. No.: 247,263

[22] Filed: May 23, 1994

[51] Int. Cl.$^6$ .................................................. H03M 1/66
[52] U.S. Cl. ........................................... 341/144; 341/136
[58] Field of Search ............................... 341/133, 134, 341/135, 136, 139, 144

[56] References Cited

U.S. PATENT DOCUMENTS

| | | | |
|---|---|---|---|
| 4,168,528 | 9/1979 | Comer | 341/144 |
| 4,607,248 | 8/1986 | Botka et al. | 341/133 |
| 4,701,694 | 10/1987 | Penney et al. | 341/139 |
| 4,982,192 | 1/1991 | Murooka | 341/135 |
| 5,218,364 | 6/1993 | Kumazawa et al. | 341/136 |

*Primary Examiner*—Howard L. Williams
*Attorney, Agent, or Firm*—Parmelee, Bollinger & Bramblett

[57] ABSTRACT

An integrated-circuit (IC) chip formed with a D/A converter (DAC) having a digitally-programmable circuit for setting the full-scale output range of the DAC by controlling its gain. The IC chip further includes analog sync level generator circuitry for driving computer graphics CRTs. The sync level generator circuitry is integrated with the DAC circuitry in such a way that the sync signal levels track changes made to the full-scale operating output range of the DAC and also track with changes in operating conditions such as varying temperature, supply voltage and RSET resistance in the DAC current control circuitry.

23 Claims, 12 Drawing Sheets

| DESIRED VIDEO LEVEL | A B C | WSET | DAC GAIN (K) =WDAC/WSET | DAC FULL SCALE (BLACK-WHITE MAG) | | PEDESTAL | | NEG SYNC | |
|---|---|---|---|---|---|---|---|---|---|
| | | | | | | IBLANK | VPED | ISYNC | VSYNC |
| NTSC RS343A, SYNC+PEDESTAL | 0 1 1 | 704 | 5626.5/704 = 7.99 | 17.62mA | 660mV | 1.44mA | 54mV | 7.62mA | 286mV |
| CIR PAL SYNC, NO PEDESTAL | 1 0 1 | 686 | 5626.5/686 = 8.45 | 18.62mA | 698mV | 1.52mA | N/A | 8.05mA | 302mV |
| NON-STD RS343, SYNC. NO PED | 1 1 0 | 651 | 5626.5/651 = 8.64 | 19.05mA | 714mV | 1.58mA | N/A | 8.24mA | 309mV |
| NTSC RS170, SYNC+PEDESTAL | 1 1 1 | 503 | 5626.5/503 = 11.19 | 24.67mA | 925mV | 2.02mA | 76mV | 10.66mA | 400mV |
| | | | | (K)(IREF) | | (IREF)(460/WSET) | | (IREF)(2432/WSET) | |

FIG. 8

| FIG. 9A | FIG. 9B |
|---------|---------|

DAC WITH DIGITALLY-PROGRAMMABLE GAIN AND SYNC LEVEL GENERATION

BACKGROUND OF THE INVENTION

1. Field of the Invention

This invention relates to D/A converters used in systems where it is important to be able to controllably alter the full-scale output of the converter, for example, where the converter is used to develop signals for various types of CRT displays.

2. Background of the Invention

DACs are extensively used for developing analog signals for a wide variety of functions. One important application is that of controlling the electron beam intensity of CRT color guns. In such application, it frequently is desirable to change the full-scale output signal level of the DAC. Generally this has been done by altering the value of some external component such as a current-setting resistor (RSET), or changing the resistance of an output load resistor of a current output DAC, or altering the output of a VREF or IREF reference source used with the DAC. Such means are satisfactory where the DAC is set up permanently at the factory, but not where there is need to make changes from time to time in the field, such as when used with instrument actuators of different input ranges, or to supply CRT video inputs with different Full Scale video levels.

No optimum DAC design arrangement exists for making full-scale output changes on a real time basis, such as might be needed in a video DAC or RAMDAC. A variety of expedients have been adopted, such as the use of a variable resistor network in place of the current setting resistor, or the use of a programmable gain amplifier on the DAC output. However, none of these has been fully satisfactory, due to lack of accuracy, matching, frequency response, or other limitations. Thus there exists a need for developing a DAC design capable of having its full-scale output level altered quickly and easily.

A CRT video DAC with adjustable setting of full-scale output must meet special requirements applicable to CRT displays. This is because the video-DAC in a graphics system typically generates only the Black-White portion of a graphics video waveform. The other portions (pedestal, sync level) are usually generated by auxiliary current sources in the DAC. When the full scale amplitude of the video signal is adjusted, these other levels must also vary by the same amount in order to keep correct ratios. This is also true for the video signal in a High-Definition TV system (HDTV) which contains an extra positive sync level which must also track. The extra Positive Sync Tip often is developed by an additional current source, external to the DAC, and driven by another sync signal (herein referred to as a Trisync signal). Such an arrangement however presents difficulties in achieving effective coordination of the timing signals, resulting for example in the positive and negative portions of the sync signal "moving about" with respect to each other, and having different amplitudes and positions.

Also of importance is the fact that if one alters the full-scale output signal of the above-described type of prior art video DAC, it is difficult to make a corresponding change in the output of the external current source. Thus there is significant likelihood that there will be incorrect matching of positive and negative synchronizing signals that should track in order to achieve proper operation of the display system.

SUMMARY OF THE INVENTION

In embodiments of the invention to be described below in detail, there is provided a DAC design arrangement wherein the full-scale output signal can be programmatically altered by digital control signals supplied externally. The DAC includes MOS bit current sources, with the MOS gates all connected to a common gate bias line. The DAC further includes a control group of MOS current sources having their gates also connected to the DAC common gate bias line, together with associated circuitry providing programmable setting of the DAC gain. The individual current sources of this control group are selectively activatable by the digital control signal, and the associated circuitry is responsive to such activation to adjust the potential of the common gate bias line correspondingly and thereby alter the full-scale output level of the DAC.

In its presently preferred embodiment, the associated control circuitry for setting the DAC full-scale output includes selectively activated control current sources which deliver current to a resistor, and an amplifier, the output of which is connected to the common gate bias line. The amplifier inputs are connected to the resistor and a reference voltage. Feedback action of the amplifier maintains these two voltages equal as the control current sources are selectively switched, thereby setting the common gate bias line to the appropriate potential to produce the desired full-scale output level for the DAC.

The DAC is further provided with auxiliary MOS current sources for setting the levels of the synchronizing signals used to carry out certain timed functions of the CRT. These auxiliary current sources also have their gates tied to the common gate bias line of the DAC, so that as changes are made to the DAC full-scale output signal, the levels of the CRT synchronizing signals are correspondingly changed in a way to assure coordinated tracking of those signals.

Other objects, aspects and advantages of the invention will in part be pointed out in, and in part apparent from, the following description of preferred embodiments of the invention, considered together with the accompanying drawings.

BRIEF DESCRIPTION OF THE DRAWINGS

FIG. 3 shows RS170 protocol signals with Sync and Pedestal levels;

FIG. 4 shows RS170A/RS343 protocol signals with Sync and Pedestal levels;

FIG. 5 shows Non-Standard RS343 signals with Sync but no Pedestal;

FIG. 6 shows CCIR624

Figures 7, 7A:
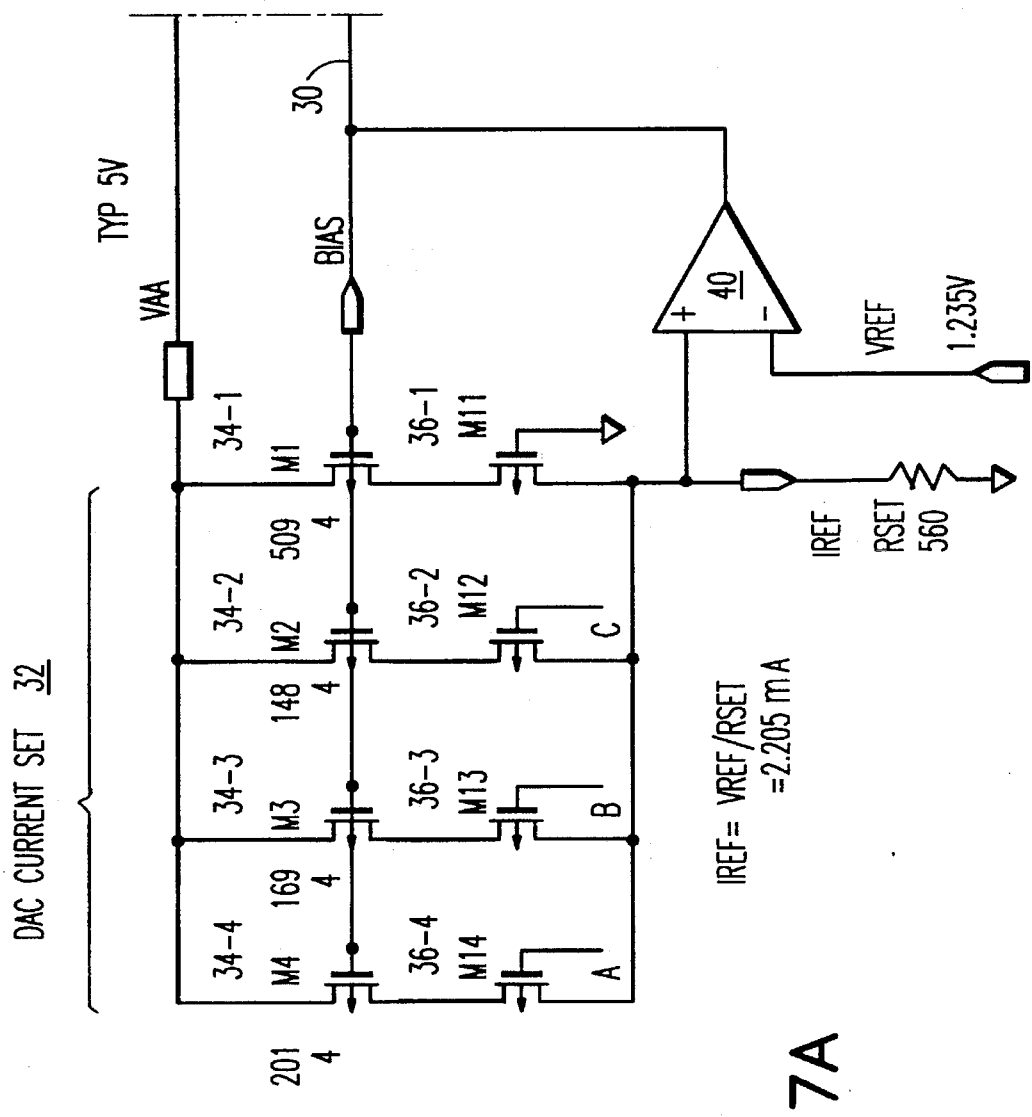
Figure 7B:
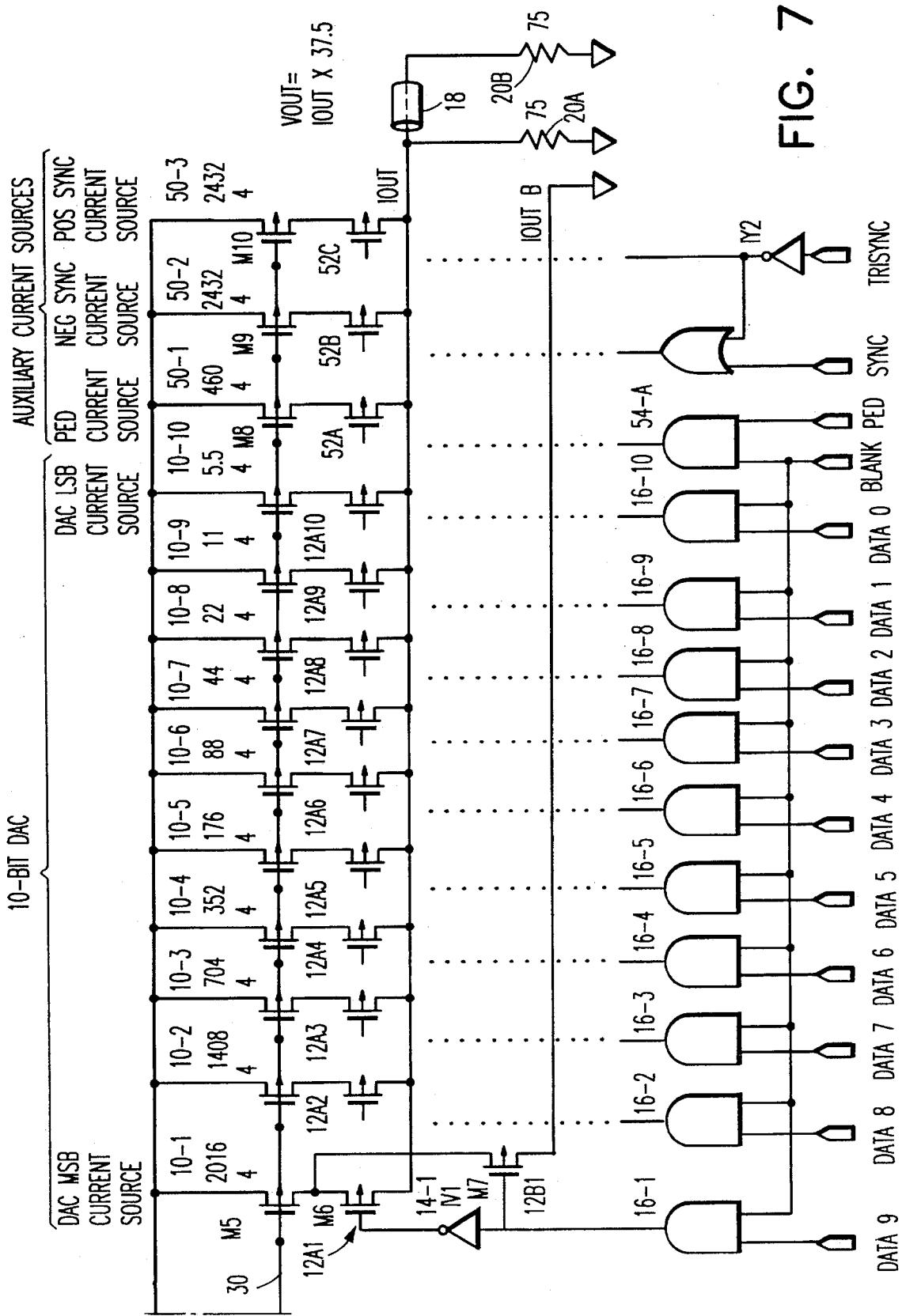
Figures 9, 9A:
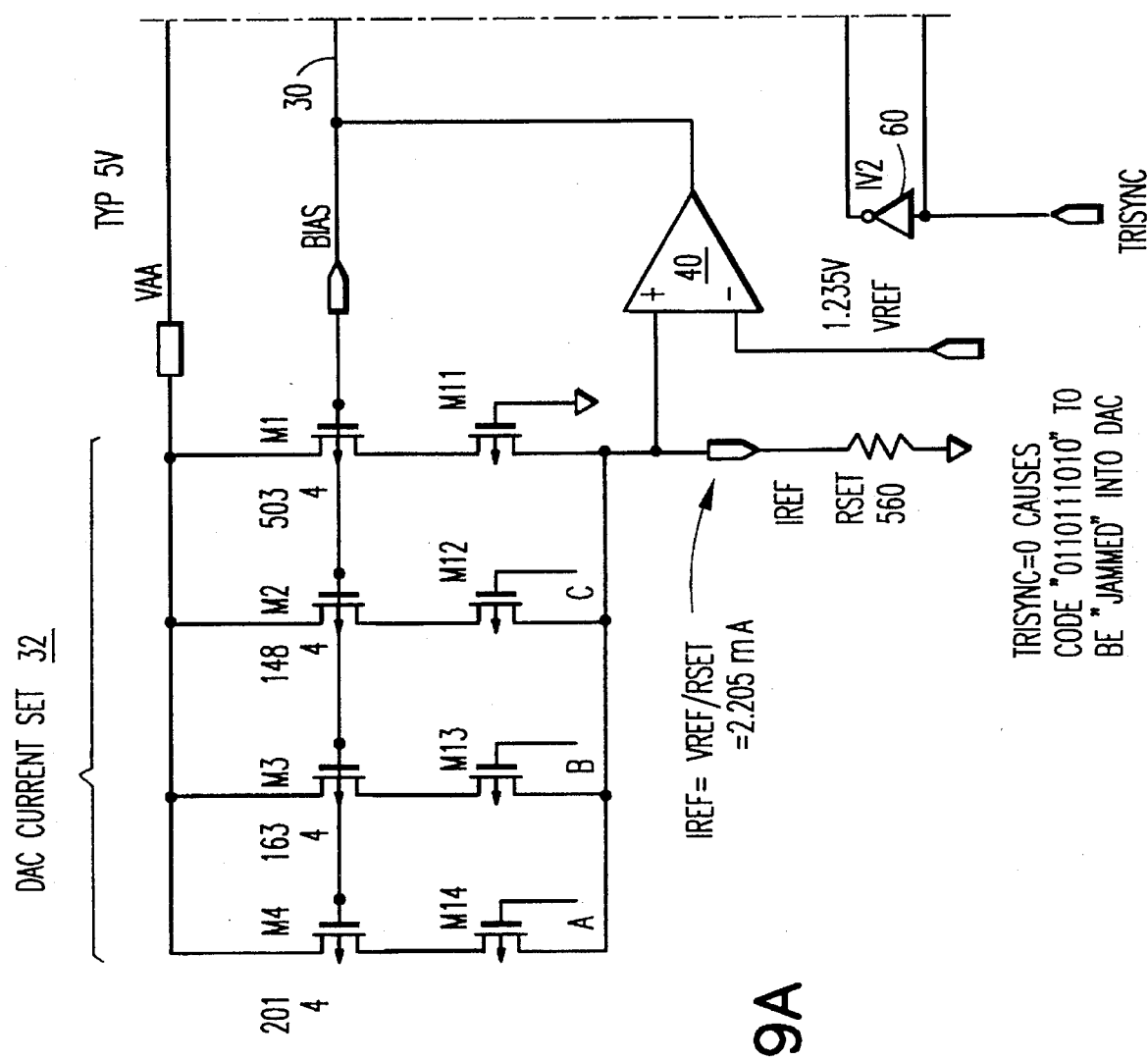
Figure 9B:
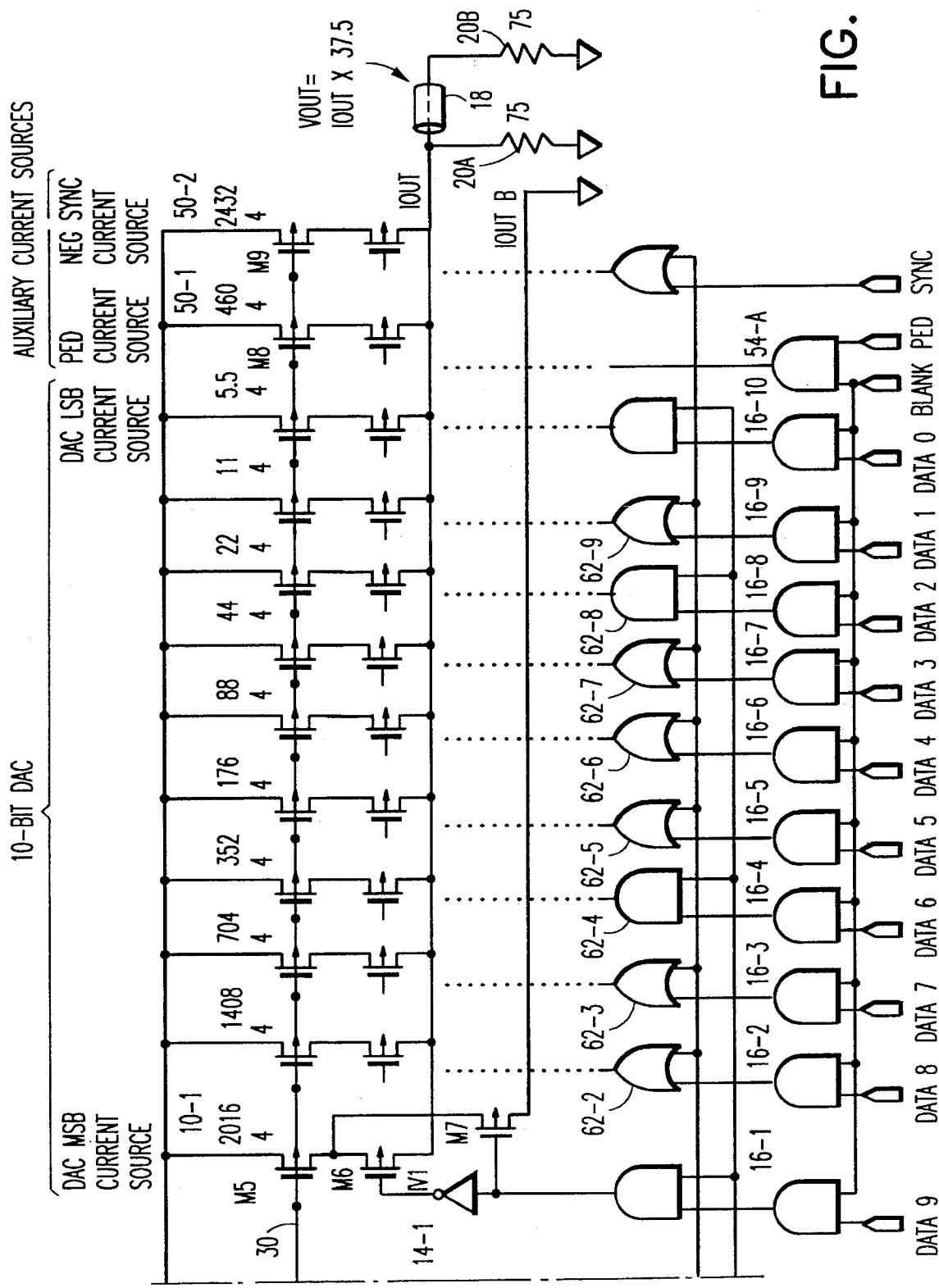
Figure 10B:
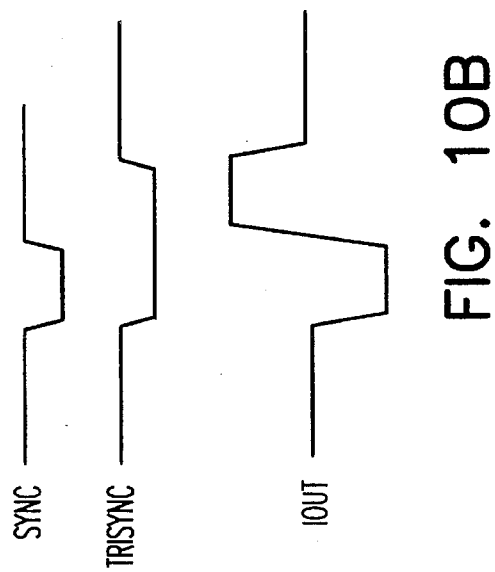
Figure 10A:
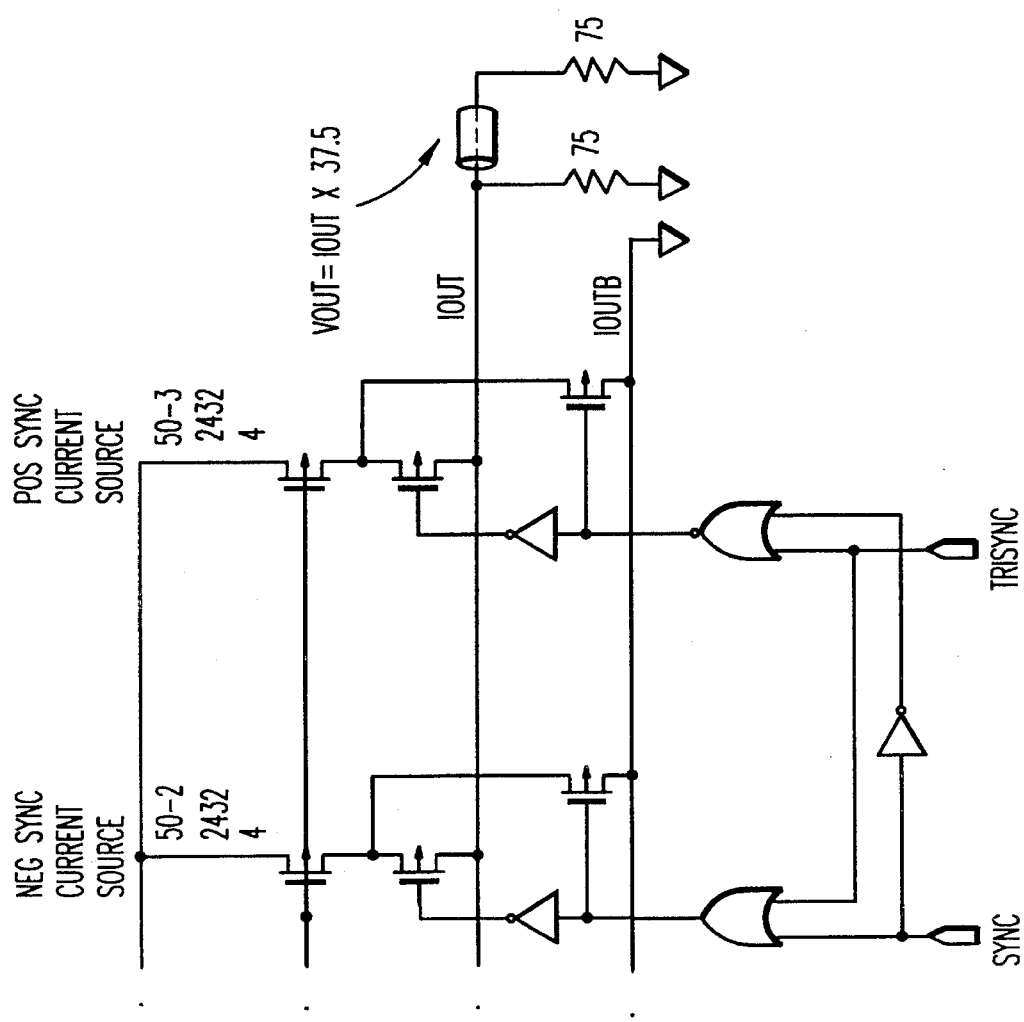
Figure 11:
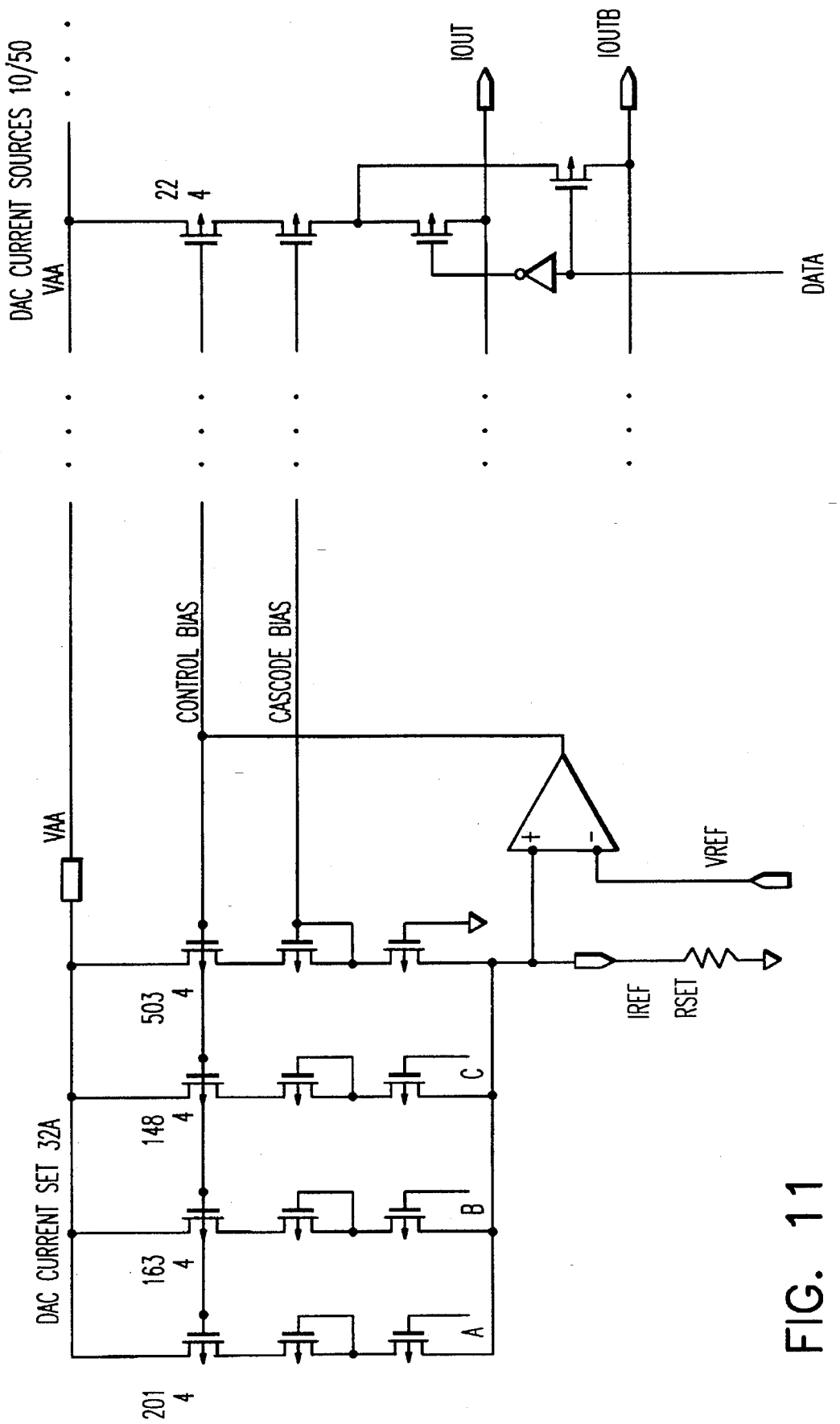
Figure 12:
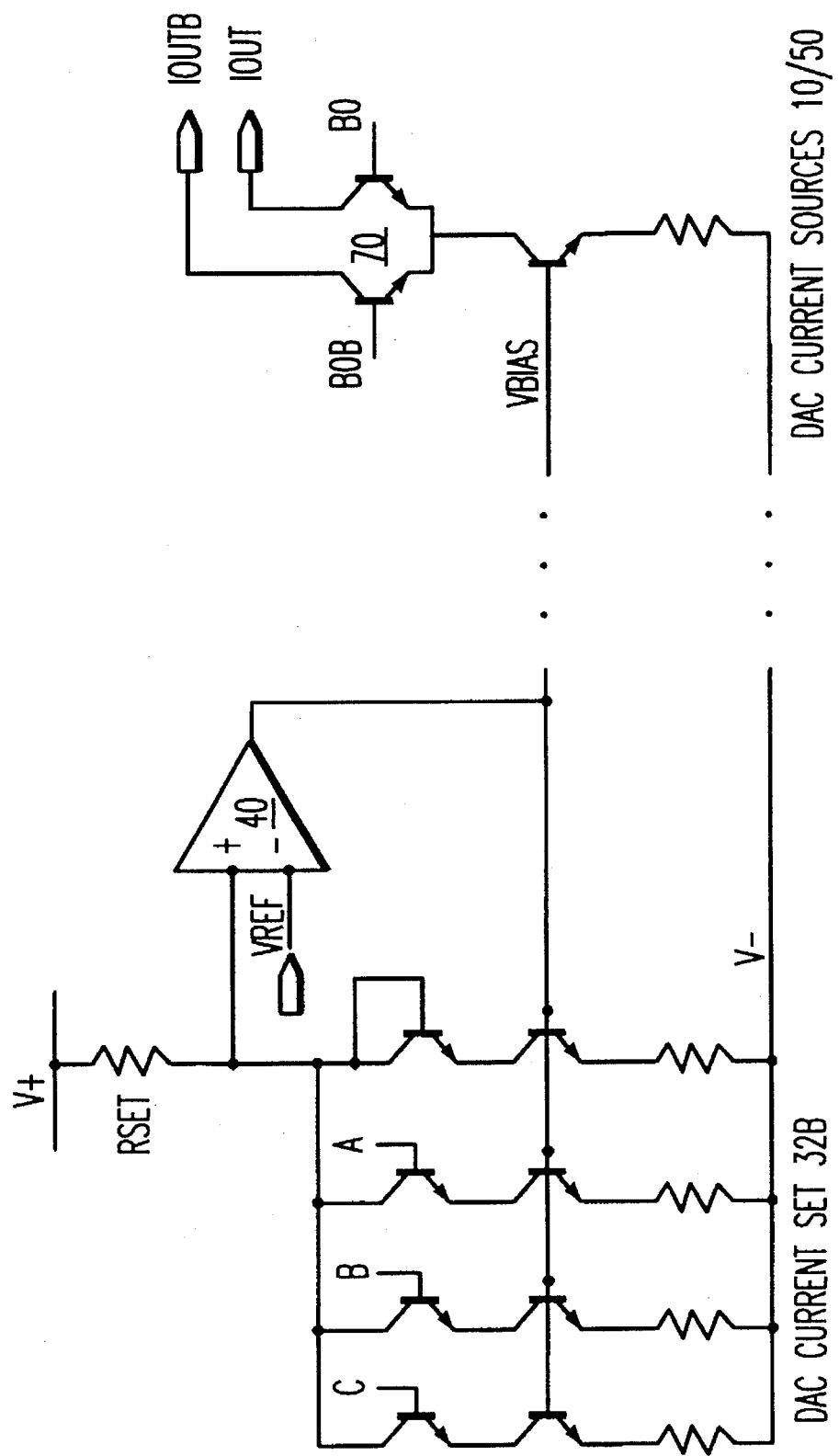

PAL signals with Sync, no Pedestal;

FIG. 7 is a diagram showing the positional relationship of FIGS. 7A and 7B;

FIGS. 7A and 7B together present a circuit diagram showing one embodiment of the present invention;

FIG. 8 is a table of voltage and current levels and DAC settings applicable to the embodiment of FIGS. 7A and B;

FIG. 9 is a diagram showing the positional relationship of FIGS. 9A and 9B;

FIGS. 9A and 9B present a circuit diagram showing another embodiment of the present invention;

FIG. 10A and 10B present a circuit diagram with a timing diagram and showing a variation of part of the embodiment of FIGS. 7A and 7B;

FIG. 11 is a circuit diagram showing alternative circuit arrangements useful in the embodiments of FIGS. 7A/7B and 9A/9B; and FIG. 12 is a circuit diagram showing still other alternative circuit arrangements useful in the embodiments of FIGS. 7A/7B and 9A/9B.

DETAILED DESCRIPTION OF PREFERRED EMBODIMENTS

Figure 1:
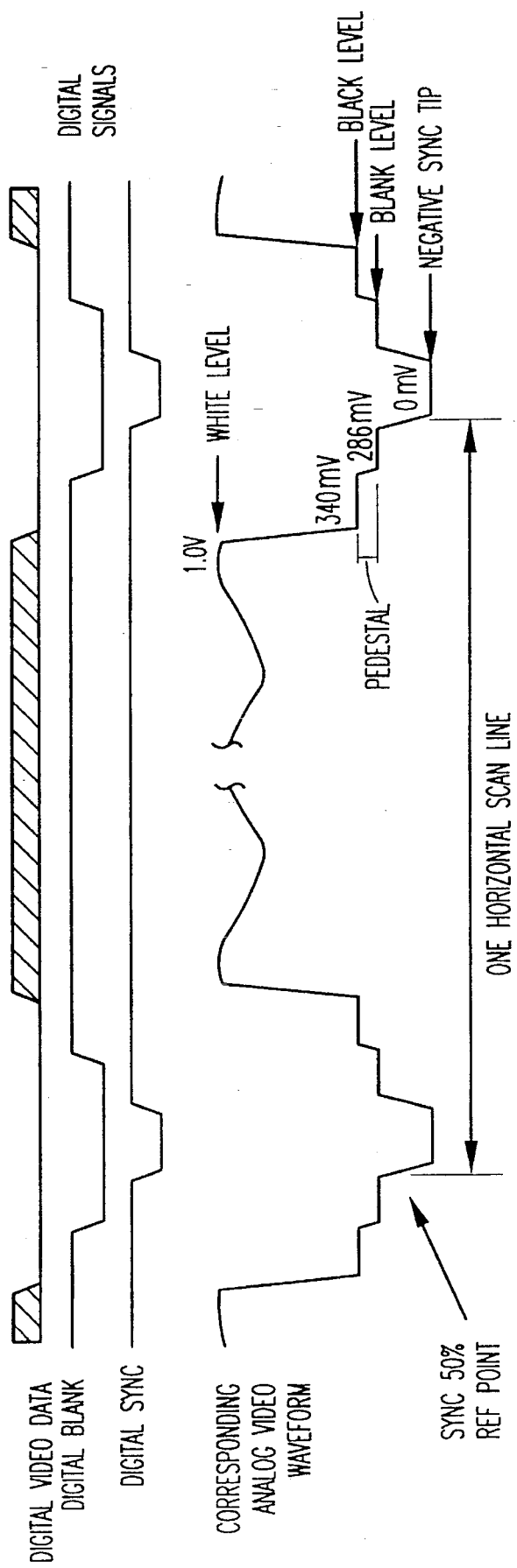
FIG. 1 is a timing diagram showing typical video-DAC waveforms in a graphics system.

FIG. 1 is a timing diagram showing typical digital signals in a CRT graphics system during one horizontal line of video, and the corresponding analog video waveform for the RS343 protocol, i.e., the amplitude levels which would be produced by a video-DAC in response to the digital signals. The Data, Blank and Sync signals typically would come from a master graphics controller, and the Pedestal ("PED") signal typically would come from a bit in a control register which would be set by the user, dependent on whether or not a Black-to-Blank pedestal was required. Although RS343 specifies the Negative Sync Tip at −300 mV, in this diagram the entire signal has been shifted up by 300 mV to facilitate the use of a single supply DAC; this change is immaterial to most users since video signals are usually AC coupled. Note that all video timing is referenced to the 50% point of the falling edge of the Sync portion of the signal.

Figure 2:
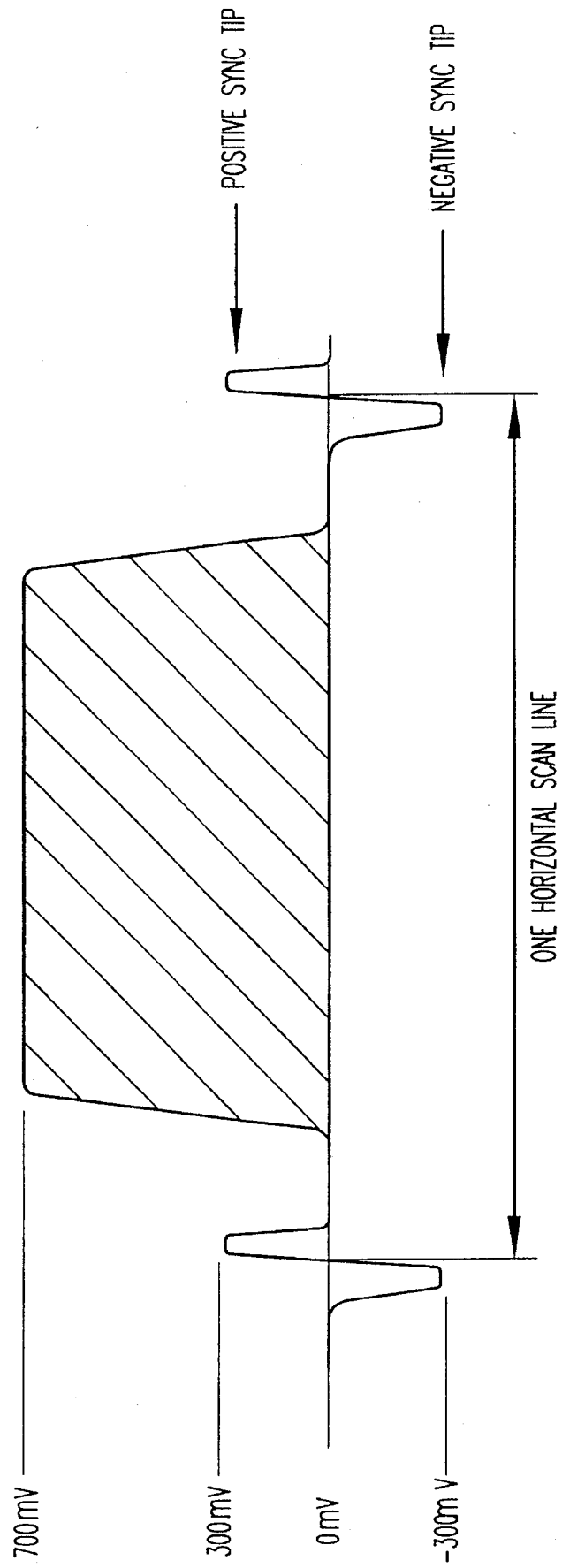
FIG. 2 is a timing diagram showing video levels in accordance with SMPTE240M (HDTV) protocol.

FIG. 2 shows the video levels for an HDTV video signal in accordance with the SMPTE240M protocol. One of the main differences over the FIG. 1 waveform is that the HDTV waveform contains an extra positive sync level (third level or "Trisync"). This makes it much easier to detect the mid-point timing reference (half way between the negative and positive sync tips) in the presence of noise or amplitude variations.

FIGS. 3 to 6 show waveforms in accordance with various standard and non-standard video signal protocols which also include the positive sync tip from the SMPTE240M standard. Modern computer systems tend to require these video levels in order that they can drive various types of graphics monitors, e.g., NTSC, PAL, HDTV, and an NTSC variation without a pedestal (modern CRT monitors do not require a Black-to-Blank pedestal, so the pedestal becomes a useless waste of 7.5% of the monitor's useable range). An interesting feature of these waveforms is that the negative-to-positive sync value is always within a few percent of the required value in the SMTPE240M standard (600 mV or ± 300 mV).

The DAC apparatus described hereinafter is able to produce any of the waveforms shown in FIGS. 3–6 with the waveform selection being made in simple fashion by programmable digital signals supplied to the DAC. Changing the waveform requires in each case a corresponding change in the full-scale output of the DAC, and the pedestal and sync signal levels are altered correspondingly to assure proper tracking.

Referring now to FIGS. 7A and 7B, the DAC shown there forms part of an integrated circuit (IC) and includes ten MOS bit-current sources 10-1 to 10-10 having binarily-weighted current outputs. The MSB current source 10-1 is at the left-hand end, and the LSB source 10-10 is at the right-hand end. These bit current sources all are connected to respective differential output switch circuits each including a pair of complementary-driven MOS switches 12A1, 12B1 and so on.

To simplify the presentation, only the differential switch circuitry for the MSB source is shown in its entirety. This circuitry includes an inverter 14-1 driven by a logic signal from a corresponding AND gate 16-1 to turn on the switch 12A1 when the logic signal is a "1". That logic signal from the AND gate also is applied directly to the other switch 12B1 which thus operates in complementary fashion.

There are ten such AND gates 16-1 to 16-10, one for each of the bit current sources 10-1 to 10-10. These AND gates receive the DAC digital input signal, with each bit signal being directed to a corresponding AND gate, together with a "blank" signal for turning off the analog input to the CRT during the beam retrace times.

One switch (12A1, 12A2, etc.) of each pair of complementary-driven switches serves when turned on to activate the respective current source by directing its current to the output line IOUT. The net current directed from all of the current sources to this output line is in turn supplied to a coaxial output cable 18 having load resistors 20A, 20B at its ends. The other switch (12B1, 12B2, etc.) of each pair of complementary-driven switches serves when turned on to connect the respective current source to a complementary output line IOUTB, leading to the ground reference bus. Although the current sources in this configuration remain on at all times, the DAC could be arranged in such a way that the sources are activated by being turned on.

The level of current produced by each source 10-1, 10-2, etc., is controlled by the potential on the corresponding MOS gate. All of these gates are connected to a common gate bias line 30 the potential of which is set by special circuitry to be described and generally indicated at 32 in FIG. 7A. This circuitry includes a group of four (in this case) different-sized MOS current sources 34-1 to 34-4 having their gates tied to the common bias line 30.

The outputs of these sources 34-1 to 34-4 are directed to respective MOS switches 36-1 to 36-4. Switch 36-1 is "on" at all times. The other three switches are selectively turned on or off by an externally supplied digital control signal (A, B, C) applied to the switch gates. This digital control signal might for example be supplied by a computer under software control. When the digital control signal A, B or C is a "1" the corresponding switch is turned "off"

The lower terminals of the MOS switches 36-1 to 36-4 are connected together to deliver their current to a resistor RSET (e.g. 560 ohms), thereby developing a voltage across the resistor. This voltage is connected to one input of an op-amp 40; the other input of the op-amp is connected to a fixed reference voltage, e.g. 1.235 volts. Feedback action of the amplifier ensures that these two voltages are maintained substantially equal, thereby fixing the reference current (IREF) through RSET at 2.205 mA. This is accomplished because the amplifier output is connected to the gate bias line 30, and controls the potential of this line to effect the said equality of voltages at its inputs. This potential will be determined by which switches 36-2 to 36-4 are turned on (by digital signals A, B, C). Since this potential in turn determines the full-scale output range of the DAC, it follows that the full-scale output of the DAC is determined by the digital signals A, B, and C, i.e., the DAC output range is digitally programmable, using just one fixed Rset resistor and a fixed reference.

When the DAC described above is used as part of a video DAC or RAMDAC to generate the signals for a CRT display system, it is necessary to assure that the sync and pedestal signal levels are coordinated with changes in the DAC full-scale output so as to provide proper tracking. This is achieved instantaneously and automatically in accordance with another important aspect of this invention, as will be described hereinafter.

Referring now to the upper right-hand corner of FIG. 7B, the integrated circuit chip includes three auxiliary MOS current sources 50-1, 50-2, 50-3 having their gates connected to the common bias line 30. The currents from these sources preferably are directed to differential switch circuitry like that used with the bit-current sources 10-1, etc., and which includes respective pairs of complementary-driven switches. For simplicity, only the main switch 52A, B, C of each pair is shown. Also not shown is an inverter (like 14-1) for turning on the switches 52A, etc., when the corresponding complementary switch (not shown) of the pair is off. The main and complementary output currents from these auxiliary current sources are connected respectively to the IOUT and IOUTB lines, and thus appear as part of the analog output currents.

These auxiliary current sources develop the most commonly required video levels as shown in FIGS. 3–6. Such video levels (and others if desired) can be developed totally under software control, without requiring any external component adjustment. It will be seen that the video levels generated are always correct and track the full-scale output current of the DAC because they are developed by current sources which are part of the DAC structure.

Figure 3:
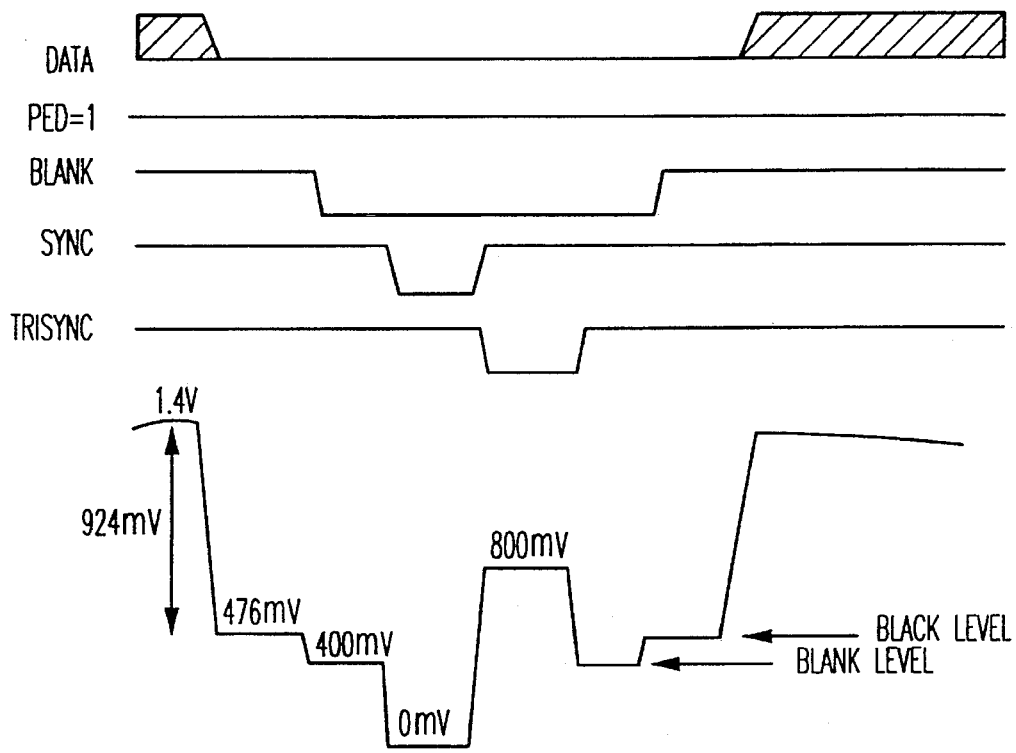
FIGS. 3, 4, 5, and 6 are timing diagrams showing CRT amplitude and timing signals in accordance with various video standards, but also including the Positive Sync Tip outlined in SMPTE240M as follows.
Figure 4:
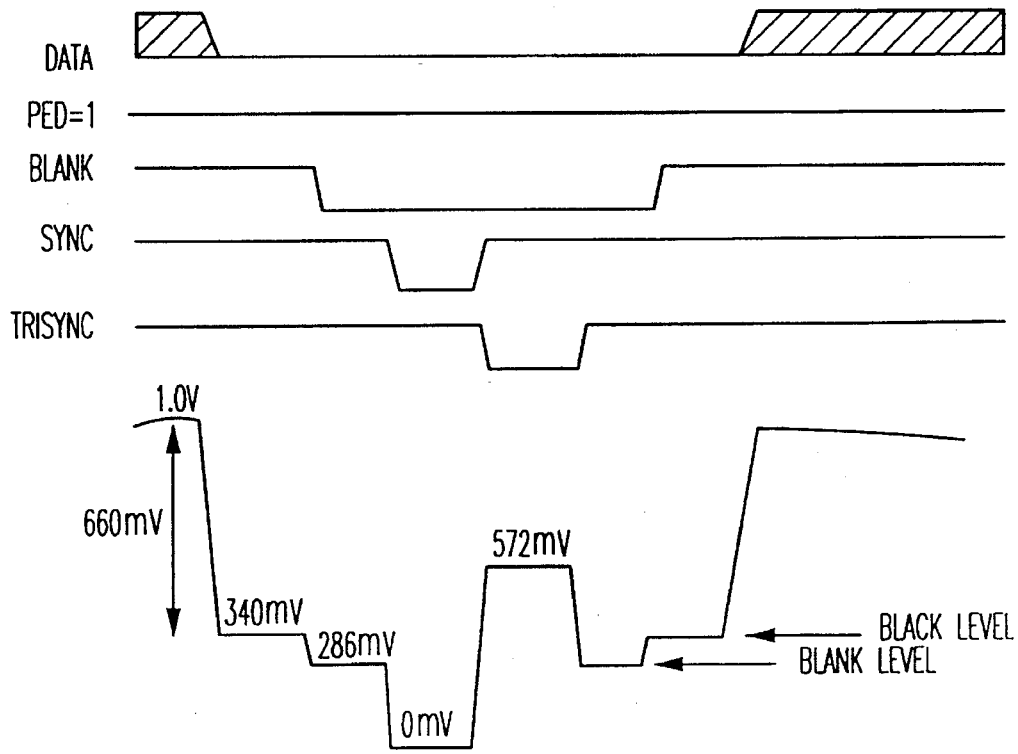
Figure 5:
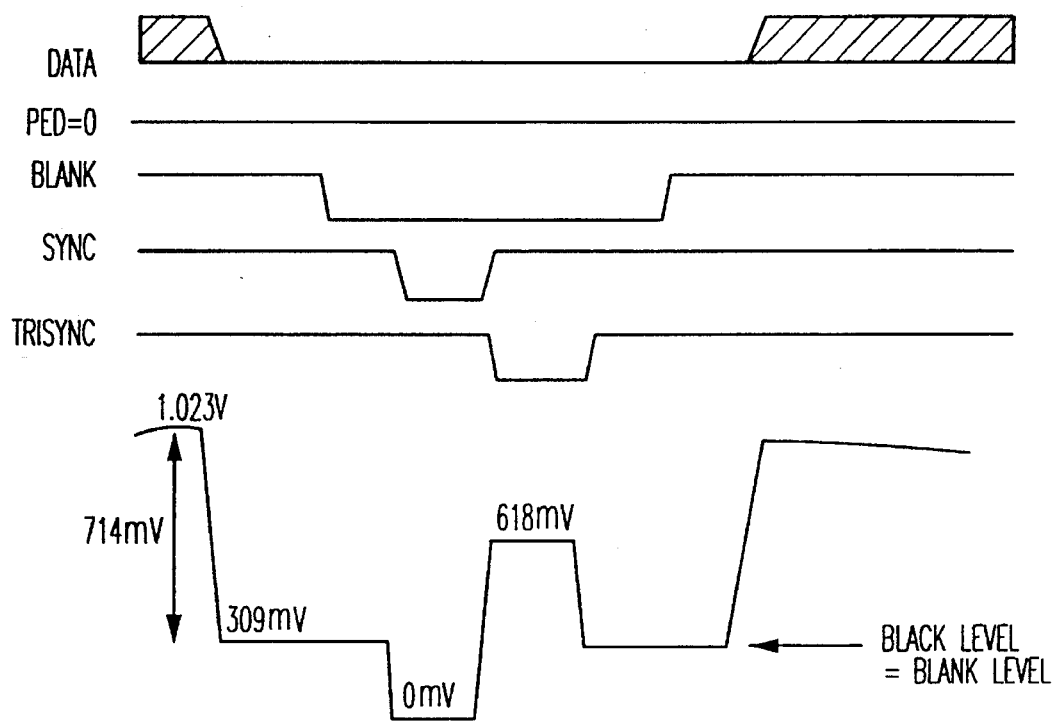
Figure 6:
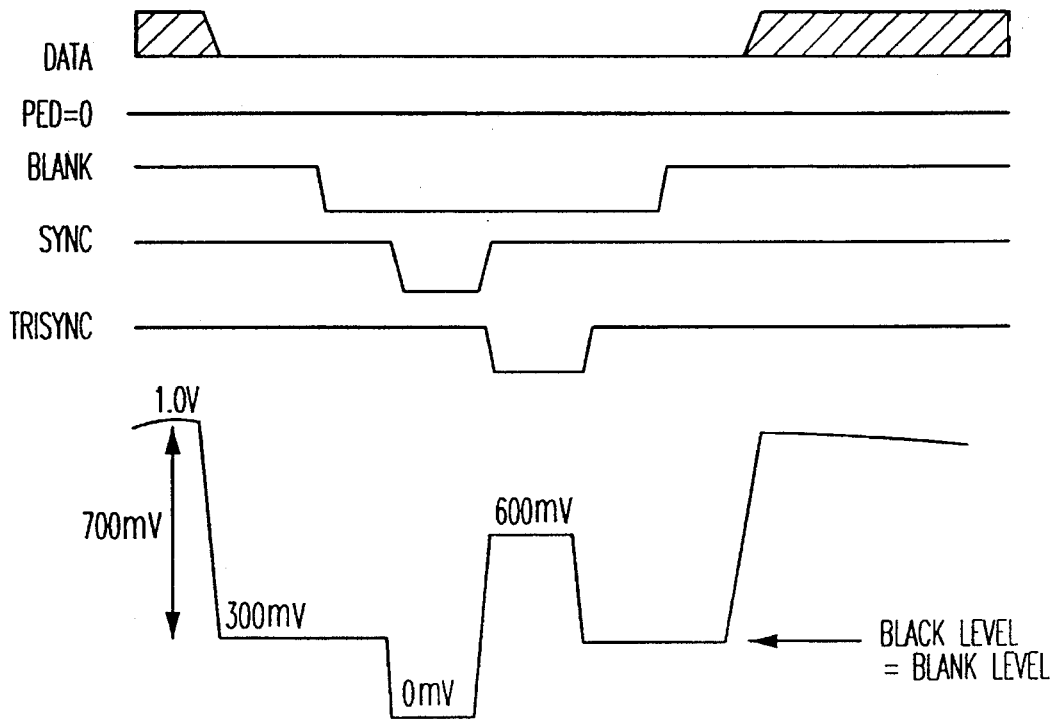

The first of these auxiliary sources 52A provides current for a pedestal signal, as previously described and illustrated in FIGS. 3 and 4. The differential switches for this current source are controlled by the logic output of an AND gate 54A which receives the Blank control signal together with a Pedestal control signal "PED", e.g., supplied by a computer when the DAC is being programmed to provide the analog control signal formats shown in FIGS. 3 or 4 where pedestal signals are required.

The second auxiliary current source 52B controls development of the Neg Sync Tip signal illustrated in FIGS. 3–6. It should be noted that all three auxiliary sources 52A, 52B and 52C are off when the Neg Sync Tip is to be produced, as are the data-bit current sources 10-1 to 10-10, so that the video output level generated is zero.

When the Pos Sync Tip is produced, both sync sources 52B and C are turned on. The positive sync level also tracks the full-scale DAC output, and the positive and negative tips are always evenly balanced about the Blank level (i.e., the mid point), since both current sources 52B and 52C have equal currents, with equal W dimensions. Although the industry specifications for RS170/343/PAL do not include this positive sync, the described arrangement permits it to be incorporated seamlessly into a video signal, with correct levels that always track, including tracking over voltages, process and temperature variations.

The table of FIG. 8 gives the voltage and current levels of the DAC circuitry of FIGS. 7A/7B for the four CRT signal formats illustrated in FIGS. 3–6. The first data column in FIG. 8, labelled ABC, presents the four different binary signal inputs which can be applied to the gate terminals A, B, C of the control group of current sources 34-2 to 34-4 to develop the four different formats of FIGS. 3–6; the first source 34-1 remains on for all four formats. The next data column presents WSET, where W is the effective net channel width of the particular MOS transistors of the control group which have been activated; the current of this control group of sources ("DAC current set") is proportional to WSET. The next column presents the DAC gain (K), defined as WDAC/WSET, where WDAC corresponds to the net channel width of all of the DAC current sources 10-1 to 10-10. The last three columns present further current and voltage levels for the indicated circuit characteristics. Note that the channel length of all current sources is identical, so for simplicity it is left out of the ratio calculations.

The following table summarizes important aspects of the operation of the above-described circuitry:

TABLE I

1. DATABITs 0–9 add respective binary-weighted currents to IOUT only if Blank =1
2. Blank =0 always forces "0" into the DAC, i.e., Black Level
3. Blank =1 Adds Pedestal Curr Source 50-1 to IOUT only if PED =1
4. Sync =1 always adds 50-2 Current Source to IOUT
5. Trisync =0 always adds 50-2 and 50-3 to IOUT FIGS. 9A and 9B together show another embodiment of the present invention which is in many respects the same as that of FIGS. 7A/7B, but modified so as to substitute for the current produced by the Positive Sync current source 52C of the first embodiment a corresponding current supplied by current sources of the DAC itself. These DAC sources are selectively activated during the time of the positive sync pulse so as to develop the exact current needed for this sync signal.

More specifically, when Trisync goes low (zero), the binary number "011 0111 010" is "jammed" into the DAC by logic means. In more detail, and referring to the lower right-hand corner of FIG. 9A, the Trisync signal is directed to an inverter 60 which produces a logic "1" for a group of OR gates 62-2, 3, 5, 6, 7 and 9 (shown in FIG. 9B). The outputs of these OR gates are connected to corresponding current sources 10-2, 3, 5, 6, 7 and 9 to activate those sources, thus producing a preset analog output current corresponding to the code "011 0111 010". This current is equal to that previously produced in FIG. 7B by the Pos Sync current source 52C, so that source is not needed in this configuration. This preset DAC output current will of course always track the DAC set levels for any voltage, temperature, DAC gain, RSET value, and so on.

During normal operation of the DAC, when the DATA signal of FIGS. 3–6 is a "1" the output switches connected to the bit-current sources 10-1 to 10-10 are turned-on as before by the outputs of AND gates 16-1 to 16-10 responding to the states of the DATABITS 0–9.

Elimination of the positive sync current source 52C is advantageous because that source is quite large in area (nearly one-half the size of all of the DAC current sources together), so that considerable chip area is saved. That current source is in effect replaced by much smaller AND and OR gates (or by NAND and NOR gates in CMOS, which are even smaller again). A further benefit is derived from the fact that when such DACs are used in groups of three (as for developing the Red, Green, Blue control signals for a CRT), the integrated circuitry for the DACs can be brought physically closer together so as to give improved DAC-to-DAC matching, as well as eliminate the d-c current of the three sources (typically a total of 30 mA).

Although specific preferred embodiments of the invention have been shown and described above, it will be understood that other arrangements can be employed to suit particular applications. For example, FIG. 10A shows a modification of the FIG. 7B circuit to illustrate that the functions can be performed by a different combination of logic elements for controlling the pairs of switches which direct the currents from sources 50-2 and 50-3 to the output lines IOUT and IOUTB. FIG. 10B presents waveforms representing the timing signals for the FIG. 10A circuitry. FIG. 11 shows a modification of FIGS. 7A/7B comprising a cascode circuit configuration for the current sources including the DAC current sources 10/50 (only one of which 70 is shown) and the DAC current set circuitry 32A. FIG. 12 shows still another way in which the circuitry can be arranged, making use of bipolar transistors including the DAC current set circuitry 32B with A, B, C control switches, and the DAC current sources 10/50 with associated differential switch pairs (only one of which is illustrated). Although in this configuration the voltage of the base electrodes of the current source transistors is set by the op amp, the circuit could be arranged with the base voltages fixed and the voltage at the lower ends of the emitter resistors controlled by an op amp. A similar variation could be used with the MOS current sources in FIGS. 7A/7B and 9A/9B.

The controllable gain of the DAC can be implemented in still other different ways such as by replacing the four transistors 34-1 to 34-4 with any number of transistors of different ratios, e.g., binary ratios instead of those shown would give binary gain programmability (steps of 1, 2, 4, 8 and so on). The DAC can have any number of bits, and can for example have fully-segmented current sources or partially segmented current sources as shown in copending application Ser. No. 079,641, filed on Jun. 18, 1993 by the present inventor. Accordingly, it will be understood that the disclosure herein of specific embodiments of this invention should not be construed as necessarily limiting the scope of the invention since it is apparent that many changes can be made by those skilled in the art while still practicing the invention claimed herein.

What is claimed is:

1. A D/A converter for use in controlling a CRT display, said converter comprising:

a plurality of MOS current sources for producing currents of magnitude responsive to the voltage on the MOS gate;

means connecting the gates of said current sources to a common bias line;

means for selectively activating said current sources in accordance with a digital input signal to produce a composite output signal representing the activated current sources; and control means for setting the voltage of said common bias line so as to set correspondingly the full-scale output of said D/A converter;

said control means comprising means responsive to a digital control signal;

said converter further including at least one auxiliary MOS current source having its gate connected to said common gate bias line;

the current flow through said auxiliary current source setting the level of the output of said converter for controlling an operating function of said CRT.

2. A D/A converter as claimed in claim 1, wherein said auxiliary current source provides a signal establishing a synchronized pulse signal for a predetermined time period during the CRT operating cycle.

3. A D/A converter as claimed in claim 2, wherein said pulse signal is a negative tip signal.

4. A D/A converter as claimed in claim 2, wherein said pulse signal is a positive tip signal.

5. A D/A converter as claimed in claim 2, wherein said pulse signal provides a black level control signal.

6. A D/A converter as claimed in claim 2, wherein said pulse signal provides a blank level control signal.

7. A D/A converter as claimed in claim 1, including two auxiliary current sources;

said auxiliary current sources producing synchronized pulse signals respectively for establishing negative and positive tip signals for timing control of said CRT.

8. A D/A converter for use in developing analog signals for a CRT display comprising:

a plurality of transistors each having a pair of current-carrying electrodes and a control electrode, said transistors being arranged as converter current sources;

means for selectively activating said converter current sources in accordance with a digital input signal to produce a composite output signal representing the activated current sources;

means for simultaneously altering the current levels produced by all of said converter current sources while maintaining tracking between the currents;

said altering means including means responsive to a digital control signal to allow setting the full-scale output of said D/A converter to any of a discrete number of values; and an auxiliary current source under the control of said altering means to provide that its output current tracks changes in the full-scale output of said converter;

said auxiliary current source being operable during a predetermined synchronizing time of the CRT operating cycle to establish the analog output of said converter at a level to control an operating function of said CRT.

9. A D/A converter as claimed in claim 8, wherein said converter current sources are all de-activated during the time said auxiliary current source is activated.

10. A D/A converter as claimed in claim 9, including a second auxiliary current source operable during said synchronizing period;

said two current sources serving to establish negative and positive tip signals for said CRT.

11. A D/A converter as claimed in claim 8, including means operable during said synchronizing time for activating a predetermined group of said converter current sources to establish an analog signal for controlling an operating function of said CRT.

12. A D/A converter as claimed in claim 11, wherein said established analog signal provides the blank control signal for said CRT.

13. For use with a device responsive to variable analog signals corresponding to input digital signals and requiring at times selective changes in the full-scale level of said variable analog signals;

a D/A converter for converting said digital signals to said variable analog signals comprising:

a first plurality of current sources comprising transistors each having a pair of current-carrying electrodes and a control electrode;

said transistors producing currents of binarily-related magnitude and proportional to the voltages on the control electrodes;

means connecting the control electrodes of said current sources to a common bias line;

means for selectively activating said first plurality of current sources in accordance with said digital input signals to produce an analog output signal representing a composite of the activated current sources;

control means for setting the voltage of said common bias line so as to set correspondingly the full-scale analog signal output level of said D/A converter to any of a group of different full-scale analog signal output levels;

said control means comprising a second plurality of current sources arranged to produce predetermined currents related in respective combinations of current source currents to said different analog full-scale analog signal output levels to be produced by said converter;

at least some of said second plurality of current sources being selectively actuable by control signals applied thereto; and means responsive to the outputs of said second plurality of current sources and operable when said second current sources are individually or combinationally activated to alter the voltage of said common bias line to change the full-scale analog signal level of said converter from one to another of said different full-scale analog signal levels.

14. Apparatus as claimed in claim 13, wherein said second plurality of current sources produce currents which are non-binarily-weighted and provide predetermined current levels when activated in selected combinations corresponding to the different full-scale analog signal levels required by said device.

15. Apparatus as claimed in claim 13, wherein said second plurality of current sources comprise MOS transistors with their gates connected to said common bias line.

16. Apparatus as claimed in claim 15, including an operational amplifier having its output connected to said common bias line;

a resistor connected to the input circuit of said operational amplifier to conduct current produced by said second plurality of current sources and to develop a corresponding voltage at the input circuit; and a reference signal connected to the input circuit of said operational amplifier to provide that the amplifier output voltage is related to the current through said resistor.

17. Apparatus as claimed in claim 13, including an auxiliary current source associated with said first plurality of current sources for producing from said converter a predetermined analog output signal level at times when the first plurality of current sources are not being operated to produce an analog output signal responsive to said digital input signal.

18. A D/A converter for use in developing analog signals for a device responsive to first variable analog signals corresponding to a digital input signal and requiring at predetermined periods of time a preset analog signal level for effecting an operating function of said device, said converter comprising:

a plurality of transistors each having a pair of current-carrying electrodes and a control electrode, said transistors being arranged as converter current sources;

means for selectively activating said converter current sources in accordance with said digital input signal to produce a composite output signal representing the activated current sources;

means for altering the current levels produced by all of said converter current sources while maintaining tracking between the currents;

said altering means including means responsive to a digital control signal to allow setting the full-scale analog output of said D/A converter to any of a discrete number of values; and an auxiliary current source associated with said first plurality of current sources and operable during said predetermined periods of time to establish the analog output of said converter at a particular analog signal level to effect said operating function of said device.

19. Apparatus as claimed in claim 18 wherein said auxiliary current source is under the control of said altering means to provide that its output current tracks changes in the full-scale output of said converter.

20. The method of controlling the conversion of a digital signal to an analog signal by selectively setting the full-scale analog output signal level to any one of a group of predetermined signal levels comprising the steps of:

developing a first set of currents by means of a first set of respective current sources which are activatable by corresponding digital signals;

said first set of currents being binarily related;

combining selected ones of said first set of currents which are developed by the activated current sources to produce an analog output signal responsive to said digital signals;

controlling the magnitudes of said first set of currents in unison by a controllable bias voltage applied to all of said first current sources and capable of being adjusted to any one of a plurality of preset non-binarily-related values of respective magnitudes for fixing the full-scale analog signal output level at any one of a group of corresponding predetermined non-binarily-related full-scale output signal levels; and setting the magnitude of said bias voltage to any selected one of said plurality of values by application to a control means of the combined currents of a second set of current sources selectably activatable in combinations corresponding respectively to said plurality of non-binarily-related bias voltage values so as to fix the full-scale analog signal output level at the corresponding one of said group of predetermined non-binarily-related full-scale output signal levels in accordance with the selected activated combination of said second set of current sources.

21. The method of claim 20, wherein said bias voltage is developed by applying said combined currents of said second set of current sources to an operational amplifier the output of which serves to produce said controllable bias voltage.

22. The method of claim 20, wherein said first set of currents is produced by MOS transistors.

23. The method of claim 22, wherein said second set of current sources comprise MOS transistors.

* * * * *